United States Patent
Hishinuma

(10) Patent No.: US 9,084,347 B2
(45) Date of Patent: Jul. 14, 2015

(54) POWER SUPPLY MOUNTING STRUCTURE AND VEHICLE PROVIDED WITH SAME

(71) Applicant: Shoji Hishinuma, Nissin (JP)

(72) Inventor: Shoji Hishinuma, Nissin (JP)

(73) Assignee: TOYOTA JIDOSHA KABUSHIKI KAISHA, Toyota-Shi (JP)

(*) Notice: Subject to any disclaimer, the term of this patent is extended or adjusted under 35 U.S.C. 154(b) by 46 days.

(21) Appl. No.: 13/951,722

(22) Filed: Jul. 26, 2013

(65) Prior Publication Data

US 2014/0027190 A1 Jan. 30, 2014

(30) Foreign Application Priority Data

Jul. 30, 2012 (JP) ................. 2012-168645

(51) Int. Cl.
*B60K 1/04* (2006.01)
*H05K 5/02* (2006.01)
*B60R 5/04* (2006.01)

(52) U.S. Cl.
CPC ............. *H05K 5/0217* (2013.01); *B60K 1/04* (2013.01); *B60R 5/04* (2013.01); *B60K 2001/0416* (2013.01)

(58) Field of Classification Search
CPC ............ B60K 1/04; B60K 2001/0416; B60K 2001/0422; B60K 2001/0427; B60K 2001/0433; H05K 5/0204; H05K 5/0217; H05K 5/0239; H05K 5/03
USPC ........................................ 180/68.5
See application file for complete search history.

(56) References Cited

U.S. PATENT DOCUMENTS

| | | | | |
|---|---|---|---|---|
| 5,501,289 A * | 3/1996 | Nishikawa et al. | .......... | 180/68.5 |
| 5,620,057 A * | 4/1997 | Klemen et al. | .......... | 180/68.5 |
| 6,227,322 B1 * | 5/2001 | Nishikawa | .......... | 180/68.5 |
| 6,547,020 B2 * | 4/2003 | Maus et al. | .......... | 180/68.5 |
| 6,662,891 B2 * | 12/2003 | Misu et al. | .......... | 180/68.1 |
| 6,668,957 B2 * | 12/2003 | King | .......... | 180/68.5 |
| 7,108,091 B2 * | 9/2006 | Guidry et al. | .......... | 180/68.1 |
| 7,219,758 B2 * | 5/2007 | Guidry et al. | .......... | 180/65.31 |
| 7,396,075 B2 * | 7/2008 | Ohkuma et al. | .......... | 297/180.1 |
| 8,127,876 B2 * | 3/2012 | Phillips | .......... | 180/68.2 |
| 8,276,696 B2 * | 10/2012 | Lucas | .......... | 180/68.2 |
| 8,338,016 B2 * | 12/2012 | Marukawa et al. | .......... | 429/120 |
| 8,372,530 B2 * | 2/2013 | Kubota et al. | .......... | 429/100 |
| 8,505,668 B2 * | 8/2013 | Iwakami et al. | .......... | 180/220 |
| 8,567,543 B2 * | 10/2013 | Kubota et al. | .......... | 180/68.5 |
| 8,574,747 B2 * | 11/2013 | Okada et al. | .......... | 429/159 |
| 8,622,161 B2 * | 1/2014 | Hara | .......... | 180/65.31 |
| 2008/0318119 A1 * | 12/2008 | Watanabe et al. | .......... | 429/99 |
| 2011/0250477 A1 * | 10/2011 | Yoshida et al. | .......... | 429/61 |
| 2012/0121962 A1 * | 5/2012 | Katayama et al. | .......... | 429/120 |
| 2012/0268062 A1 * | 10/2012 | Yoneda | .......... | 320/107 |
| 2013/0176664 A1 * | 7/2013 | Ikezawa | .......... | 361/679.01 |

FOREIGN PATENT DOCUMENTS

| | | |
|---|---|---|
| JP | 05-023463 U | 3/1993 |
| JP | 2002-166728 A | 6/2002 |
| JP | 2003-335186 A | 11/2003 |
| JP | 2006-040602 A | 2/2006 |
| JP | 2008-035309 A | 2/2008 |

* cited by examiner

*Primary Examiner* — Katy M Ebner

(74) *Attorney, Agent, or Firm* — Kenyon & Kenyon LLP

(57) ABSTRACT

In a power supply mounting structure, a rib of a height that covers a gap of a case is provided protruding in a position adjacent to the gap, on a mounting surface of an interior part that is mounted to the case.

6 Claims, 5 Drawing Sheets

POWER SUPPLY MOUNTING STRUCTURE AND VEHICLE PROVIDED WITH SAME

INCORPORATION BY REFERENCE

The disclosure of Japanese Patent Application No. 2012-168645 filed on Jul. 30, 2012 including the specification, drawings and abstract is incorporated herein by reference in its entirety.

BACKGROUND OF THE INVENTION

1. Field of the Invention

The invention relates to a power supply mounting structure and a vehicle provided with this power supply mounting structure. More particularly, the invention relates to a power supply mounting structure that attaches a power supply in which an electronic component is housed in a case, and a plate-shaped interior part that is attached to at least one side of the case of the power supply and has a shape that covers the one side, to an inside of a vehicle, and a vehicle provided with such a power supply mounting structure.

2. Description of Related Art

One known power supply mounting structure includes a cabinet that houses a motherboard on which is mounted an electronic component that conducts current, such as a fuse (see Japanese Utility Model Application Publication No. 05-23463 (JP 05-23463 U), for example. In this structure, a barrier plate of another member is attached to the motherboard inside the cabinet. As a result, the barrier plate prevents foreign objects such as screw drivers and pins from being inserted into the cabinet via a jack hole.

However, with this mounting structure, the barrier plate is attached to the motherboard inside the cabinet, so if a rod-shaped foreign object is forcefully inserted the power supply through the jack hole, for example, the barrier plate may detach from the motherboard, or stress may unexpectedly act on the motherboard. Therefore, it is desirable to inhibit such a foreign object from getting into the power supply.

SUMMARY OF THE INVENTION

The invention thus provides a power supply mounting structure and a vehicle provided therewith, that inhibits a foreign object from getting into a power supply.

A first aspect of the invention relates to a power supply mounting structure that includes a power supply in which an electronic component is housed in a case, and a plate-shaped interior part that is attached to at least one side of the case of the power supply and covers the one side. The case of the power supply has at least one gap that passes through from inside to outside of the case while the interior part is attached. The interior part is provided with a rib of a height that covers the gap of the case, protruding in a position adjacent to the gap, on a mounting surface that is mounted to the case.

With the power supply mounting structure according to the first aspect of the invention, the power supply is such that the case has at least one gap that passes through from inside to outside of the case while the interior part is attached, and the interior part is provided with a rib of a height that covers the gap of the case, protruding in a position adjacent to the gap, on a mounting surface that is mounted to the case. This rib is able to cover shield foreign objects from the outside, so foreign objects are able to be inhibited from getting into the power supply through the gap in the case.

A second aspect of the invention relates to a power supply mounting structure that includes an interior part, a case, an electronic component, and a rib. The interior part has a plate shape. The case is attached to the interior part such that at least one side of the case is covered by the interior part. Also, the case has at least one gap that passes through from inside to outside of the case while the interior part is attached. The electronic component is housed in the case. The rib is provided on the interior part, in a position adjacent to the gap, protruding on a mounting surface that is mounted to the case. Also, the rib has a height that covers the gap.

A third aspect of the invention relates to a vehicle that has the power supply mounting structure described above.

The vehicle according to the third aspect of the invention has the power supply mounting structure described above, and thus is able to display the same effect as that displayed by the power supply mounting structure of the invention, e.g., the same effect of being able to inhibit a foreign object from getting into the power supply through the gap in the case.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Next, example embodiments of the invention will be described.

Figure 1:
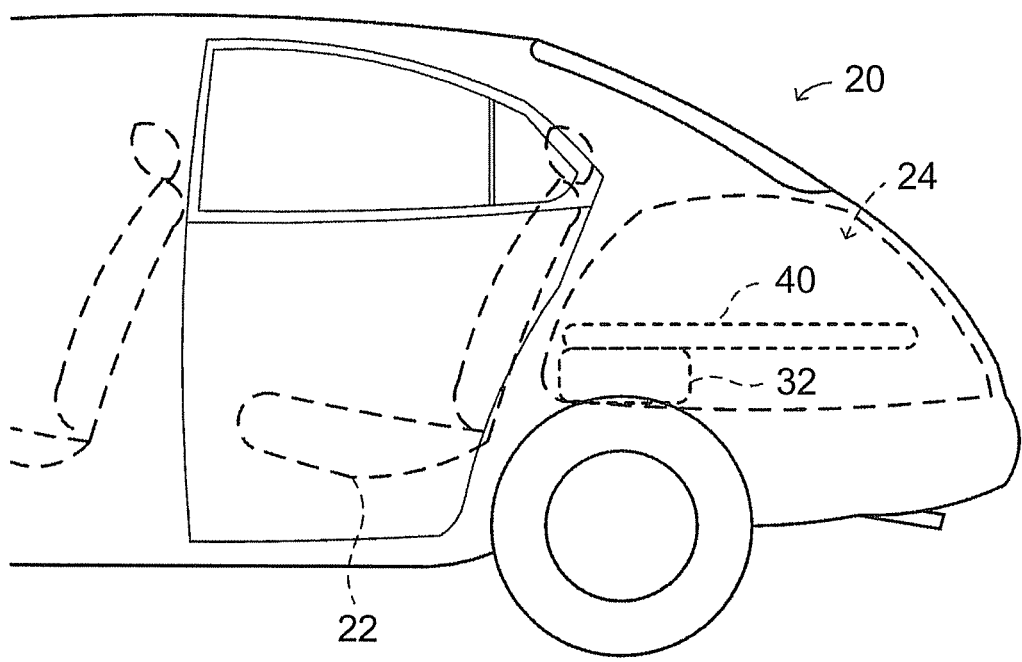
FIG. 1 is a view schematically showing the structure of a vehicle that has a power supply mounting structure according to one example embodiment of the invention.
Figure 2:
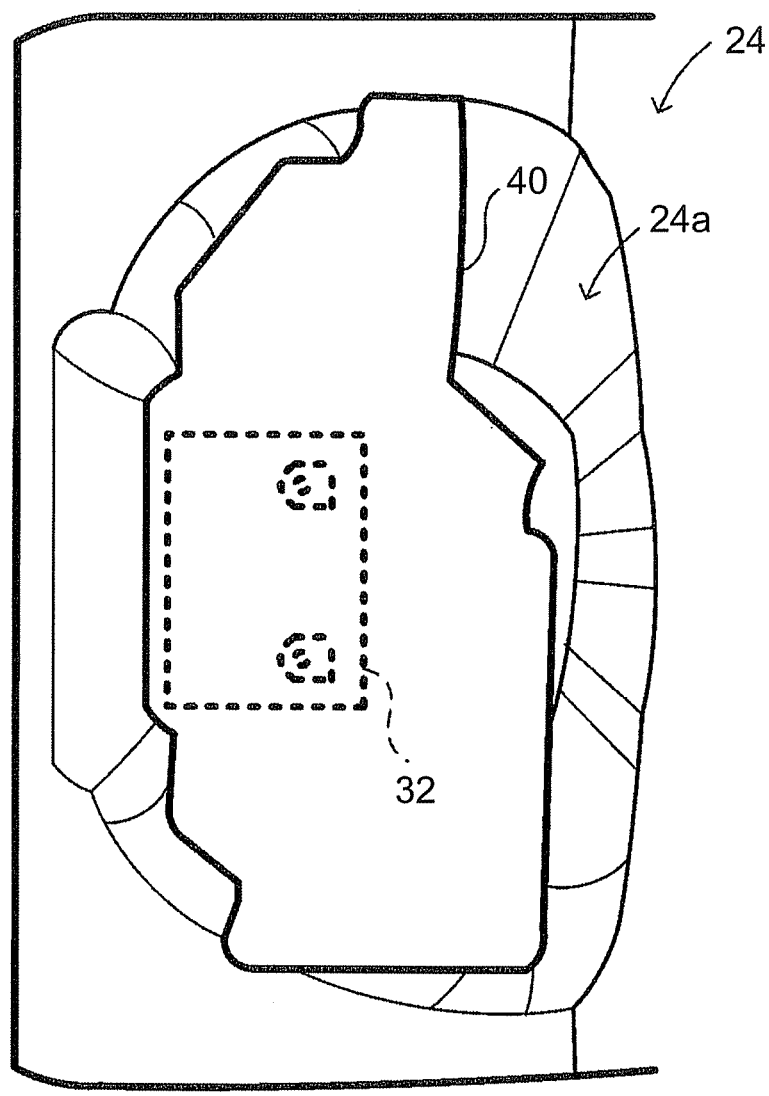
FIG. 2 is a view showing the inside of a luggage compartment when a spare tire has been removed.

FIG. 1 is a view schematically showing the structure of a vehicle 20 having a power supply mounting structure according to one example embodiment of the invention. FIG. 2 is a view showing, as viewed from above the vehicle, the inside of a luggage compartment 24 when a spare tire has been removed. The vehicle 20 in this example embodiment is configured as a well-known electric vehicle or hybrid vehicle that runs by supplying electric power from a relatively high voltage battery to an electric motor via a step-up converter. As shown in the drawing, the vehicle 20 includes a power supply 32 within which are housed electronic components such as the battery and the step-up converter, and a plate-shaped interior part 40 that is attached to an upper surface of the power supply 32. The power supply 32 and the interior part 40 are attached to a recessed portion 24a for housing a spare tire in the luggage compartment 24 behind a rear seat 22. The spare tire is placed on the interior part 40.

Figure 3:
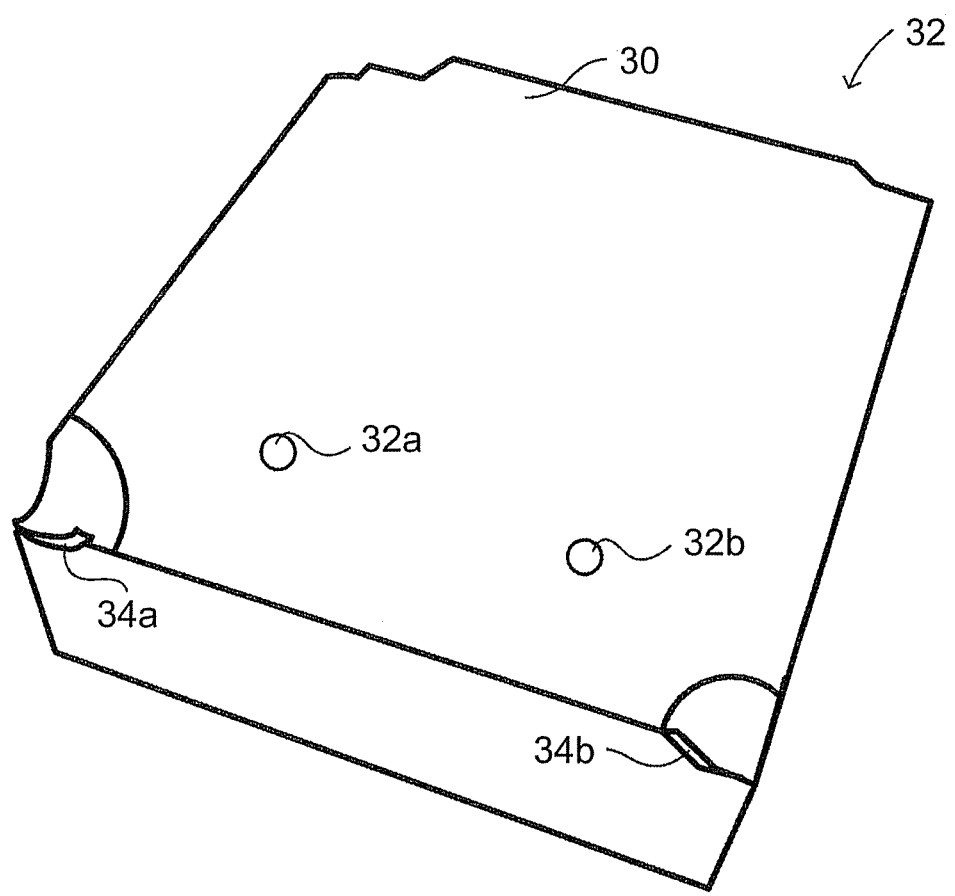
FIG. 3 is an external view schematically showing the external appearance of the power supply.

FIG. 3 is an external view schematically showing the external appearance of the power supply 32. With the power supply 32, electronic components, not shown, are housed inside a box-shaped case 30. The case 30 is formed by bending a single aluminum sheet by press-forming. The case 30 has mounting holes 32a and 32b for attaching the interior part 40 in a position away from the center of the upper surface, and has gaps 34a and 34b having widths of approximately 2 mm at the corners.

Figure 4:
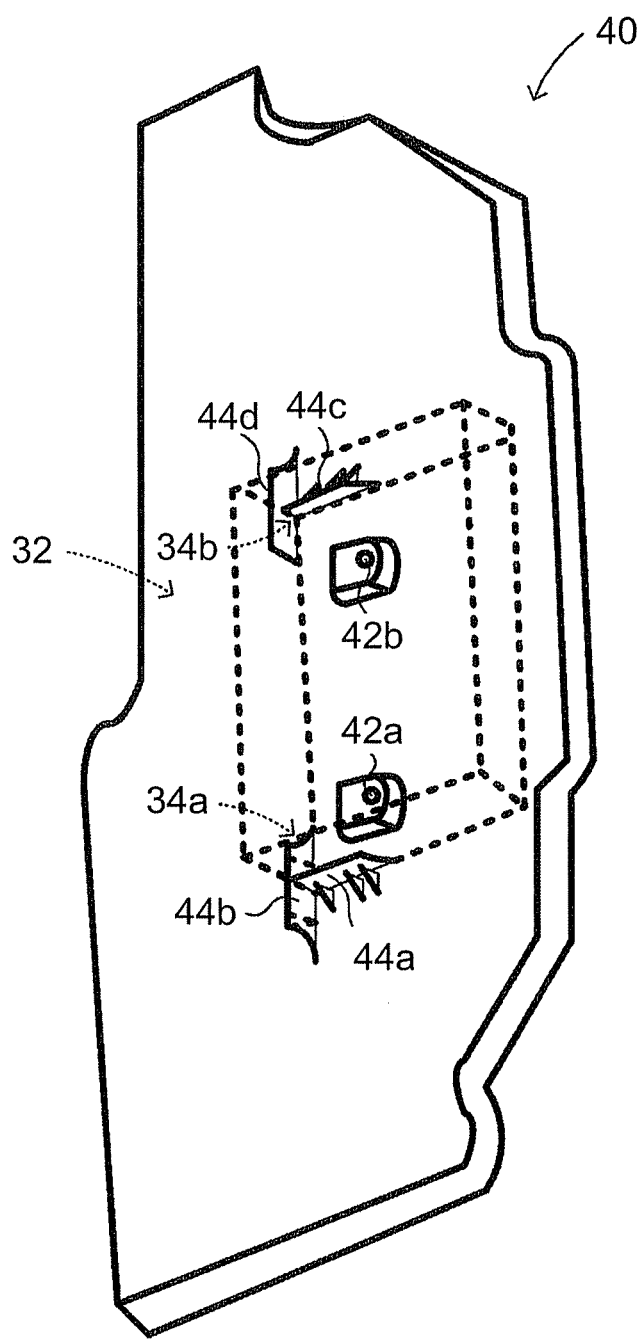
FIG. 4 is a view schematically showing the external appearance of an interior part.
Figure 5:
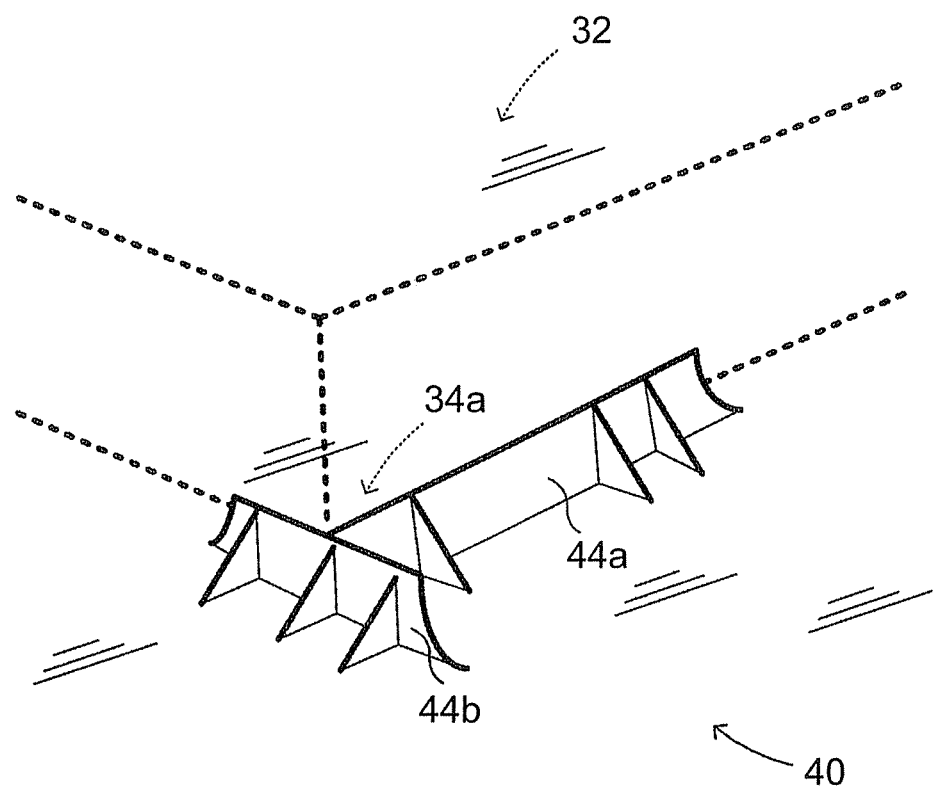
FIG. 5 is an enlarged view of main parts of the interior part.

FIG. 4 is a view schematically showing the external appearance of the interior part 40, and FIG. 5 is an enlarged view of the main portions of the interior part 40. In these drawings, the broken line indicates the power supply 32 in a state attached to the interior part 40. The interior part 40 is structured as a plate-shaped part that is made of resin having a shape that covers the upper surface of the case 30 when attached to the upper surface of the case 30.

Ribs 44a and 44b of a height enabling them to cover the gap 34a of the case 30 are provided protruding in a position adjacent to the gap 34a, on a mounting surface of the interior part 40 that is mounted to the case 30. Similarly, ribs 44c and 44d of a height enabling them to cover the gap 34b of the case 30 are provided protruding in a position adjacent to the gap 34b, on the mounting surface of the interior part 40 where the interior part 40 is mounted to the case 30. When the power supply 32 is attached to the interior part 40, even if a rod-shaped foreign object is headed toward the position of the gaps 34a and 34b from the outside, for example, the foreign object will strike one of the ribs 44a to 44d. Thus, with this kind of structure, a foreign object is able to be inhibited from getting into the power supply 32 through the gap 34a by the ribs 44a and 44b, and a foreign object is able to be inhibited from getting into the power supply 32 through the gap 34b by the ribs 44c and 44d. As a result, a foreign object is able to be inhibited from getting into the power supply 32.

Mounting holes 42a and 42b are formed on the rib 44a to 44d side, with respect to the center of the case 30, in the interior part 40. The mounting holes 32a and 32b of the case 30 are formed in positions matching the mounting holes 42a and 42b, respectively, of the interior part 40, and the interior part 40 is attached to the power supply 32 by bolts, not shown, that pass through the mounting holes 42a and 42b and the mounting holes 32a and 32b. With this kind of structure, even when bending deformation with the position where the bolts are attached to the interior part 40 as the fulcrum occurs, the ribs 44a to 44d are able to inhibit a foreign object from getting inside the power supply 32. Accordingly, it is possible to inhibit a foreign object from getting into the power supply 32.

According to the vehicle 20 in the example embodiment described above, it is possible to inhibit a foreign object from getting into the power supply 32 by providing the ribs 44a to 44d of a height that covers the gaps 34a and 34b of the case 30, protruding in a position adjacent to the gaps 34a and 34b, on the mounting surface of the interior part 40 that is mounted to the case 30. Also, by having the mounting holes 42a and 42b formed on the side with the ribs 44a to 44d with respect to the center of the case 30, in the interior part 40, and having the interior part 40 be attached to the power supply 32 by bolts, not shown, that pass through the mounting holes 42a and 42b and the mounting holes 32a and 32b, a foreign object is able to be inhibited from getting into the power supply 32 even if bending deformation occurs in the interior part 40.

In the vehicle 20 of this example embodiment, the mounting holes 42a and 42b are formed on the side with the ribs 44a to 44d with respect to the center of the case 30, in the interior part 40, but the mounting holes 42a and 42b may also be formed on the side opposite the side with the ribs 44a to 44d, with respect to the center of the case 30, and the mounting holes 32a and 32b of the case 30 may be formed in positions matching the mounting holes 42a and 42b, respectively, of the interior part 40.

In the vehicle 20 of the example embodiment, the interior part 40 is made of resin, but the material of which the interior part 40 is made is not limited to resin, as long as it is material with comparatively high insulation properties.

In the vehicle 20 of the example embodiment, the case 30 is formed by bending a single aluminum sheet by press-forming, but the case 30 may also be formed by joining a plurality of aluminum members by welding or the like, without using press-forming.

In the vehicle 20 of the example embodiment, the case 30 has the gaps 34a and 34b having a width of approximately 2 mm at the corners, but the case 30 need only have gaps 34a and 34b having a width of at least 1 mm. For example, gaps 34a and 34b having a width greater than 2 mm may also be used.

In the vehicle 20 of the example embodiment, the case 30 has two gaps 34a and 34b, but the case 30 need only have at least one gap. Thus, for example, the case 30 may have one gap, or three or more gaps.

In the vehicle 20 of the example embodiment, the gaps 34a and 34b are provided on the corners of the case 30, but the case 30 need only have a gap that extends through from the inside to the outside when the case 30 to which the interior part 40 is attached is mounted in the luggage compartment. Therefore, the gaps 34a and 34b may also be provided in the sides or surfaces of the case 30.

In the vehicle 20 of the example embodiment, the power supply 32 and the interior part 40 are mounted in the trunk space, but in a vehicle with space underneath a seat on which an occupant in a passenger compartment sits, the power supply 32 and the interior part 40 may also be mounted in the space underneath the seat.

In the example embodiment, the power supply 32 in which electronic components are housed inside the case 30 that has the gaps 34a and 34b corresponds to the power supply, and the plate-shaped interior part 40 that has the ribs 44a to 44c, and is attached to the upper surface of the case 30 of the power supply 32, and has a shape that covers the upper surface, corresponds to the interior part.

Here, the power supply is not limited to the power supply 32 in which the electronic components are housed in the case 30 that has the gaps 34a and 34b. That is, the power supply may be any power supply as long as the case has at least one gap that passes through from inside to outside when the case to which the interior part is attached is mounted inside the vehicle. The interior part is not limited to the plate-shaped interior part 40 that has the ribs 44a to 44c, and is attached to the upper surface of the case 30 of the power supply 32, and has a shape that covers the upper surface. That is, the interior part may be any interior part as long as it is a plate-shaped part that is attached to at least one side of the case of the power supply and has a shape that covers this one side, and a rib of a height that covers a gap in the case is provided protruding in a position adjacent to the, gap, on a mounting surface that is mounted to the case.

The corresponding relationships of the main elements of the example embodiment and the main elements of the invention are merely examples for describing in detail a mode for carrying out the invention. Hence, the example embodiment is not intended to limit the elements of the invention. The example embodiment is merely one detailed example of the invention.

While the invention has been described with reference to example embodiments thereof, it should be understood that the invention is not limited in any way to the example embodiments. That is, the invention may be carried out in any of a variety of modes without departing from the scope thereof The invention may be used in the vehicle manufacturing industry and the like.

What is claimed is:

1. A power supply mounting structure comprising:
a power supply in which an electronic component is housed in a case; and
a plate-shaped interior part that is attached to an upper surface of the case of the power supply and covers the one side,
wherein the case of the power supply has at least one gap that passes through from inside to outside of the case while the interior part is attached; and
the interior part is provided with a rib of a height that covers the gap of the case, protruding in a position adjacent to the gap, on a mounting surface that is mounted to the case,
wherein the rib extends downward from the interior part when the case is attached to the interior part.

2. The power supply mounting structure according to claim 1, wherein the gap of the case is a gap having a width of at least 1 mm.

3. The power supply mounting structure according to claim 1, further comprising:
a mounting member that attaches the interior part to the power supply, the mounting member fixing the interior part to the power supply in a position between the rib and a center of the case.

4. A vehicle comprising:
the power supply mounting structure according to claim 1, the power supply being arranged inside the vehicle.

5. The vehicle according to claim 4, wherein the power supply and the interior part are arranged in a space underneath a seat upon which an occupant sits, or in a luggage compartment.

6. A power supply mounting structure comprising:
an interior part having a plate shape;
a case attached to the interior part such that an upper surface of the case is covered by the interior part, the case having at least one gap that passes through from inside to outside of the case, while the interior part is attached;
an electronic component that is housed in the case; and
a rib which is provided on the interior part, in a position adjacent to the gap of the case, on a mounting surface that is mounted to the case, the rib having a height that covers the gap,
wherein the rib extends downward from the interior part when the case is attached to the interior part.

* * * * *